United States Patent
Guo

(10) Patent No.: US 11,848,656 B2
(45) Date of Patent: Dec. 19, 2023

(54) ANTI-RESONANCE STRUCTURE FOR DAMPENING DIE PACKAGE RESONANCE

(71) Applicant: ATI Technologies ULC, Markham (CA)

(72) Inventor: Fei Guo, Ottawa (CA)

(73) Assignee: ATI Technologies ULC, Markham (CA)

( * ) Notice: Subject to any disclaimer, the term of this patent is extended or adjusted under 35 U.S.C. 154(b) by 112 days.

(21) Appl. No.: 17/357,277

(22) Filed: Jun. 24, 2021

(65) Prior Publication Data

US 2022/0416750 A1 Dec. 29, 2022

(51) Int. Cl.
*H03H 7/20* (2006.01)
*H03K 5/1252* (2006.01)
*H01L 23/66* (2006.01)
*H01L 23/498* (2006.01)

(52) U.S. Cl.
CPC ......... *H03H 7/20* (2013.01); *H01L 23/49827* (2013.01); *H01L 23/66* (2013.01); *H03K 5/1252* (2013.01)

(58) Field of Classification Search
CPC ..... H03H 7/20; H01L 23/49827; H01L 23/66; H03K 5/1252
See application file for complete search history.

(56) References Cited

U.S. PATENT DOCUMENTS

| 5,016,913 A | 5/1991 | Nakajima et al. |
| 8,228,680 B2 | 7/2012 | Myat et al. |
| 9,345,126 B2 | 5/2016 | Hoshi et al. |
| 10,355,661 B1 | 7/2019 | Guo |
| 10,418,951 B2 * | 9/2019 | Poulin ...................... H03F 3/24 |

* cited by examiner

*Primary Examiner* — Cassandra F Cox
(74) *Attorney, Agent, or Firm* — Polansky & Associates, P.L.L.C.; Paul J. Polansky; Nathan H. Calvert

(57) ABSTRACT

A power delivery network, circuit, and method reduce die package resonance of an integrated circuit (IC) die. Decoupling capacitors interact with equivalent series inductances (ESLs) of power conductors within a package carrier substrate create the die package resonance characteristic. In one form an anti-resonance tuning circuit has a first branch including a first inductance coupled to one of an IC die positive power supply conductor and an IC die negative power supply conductor, and a second branch coupled directly to a selected one of a carrier substrate positive or negative conductive structures, the second branch comprising a second inductance inductively coupled to the first inductance.

22 Claims, 4 Drawing Sheets

ANTI-RESONANCE STRUCTURE FOR DAMPENING DIE PACKAGE RESONANCE

BACKGROUND

Die package resonance is a concern in the performance power delivery networks (PDNs) due to the low loss nature of PDNs. In the case of semiconductor power supplies, such resonance is a well-known issue for PDN designers. For example, in case of power supplies to processor cores, malware has been spread that can cause the power supply to oscillate. Die package resonance is due to increases in the PDN output impedance as the system operating frequency increases, which can cause the supplied voltage to drop below specification when a high current is demanded by the load. The increased output impedance is due to inductance that is inherent in the package's conductors, which connect the semiconductor to its host system, and from the capacitance of decoupling capacitors, referred to as "decaps," which are often added to the system to reduce the output impedance. The decaps lower the output impedance of the power delivery network, essentially storing and delivering energy to the semiconductor circuitry to keep the voltage at the desired level. However, the decaps do not entirely solve the problem. The decaps interact with the inductance of the package, forming a parallel LC "tank" circuit along with capacitances inherent in the semiconductor device. This circuit resonates to cause die package resonance at a resonant frequency. PDN output impedance also peaks at the resonant frequency, causing voltage to swing excessively.

There are a few existing solutions to help mitigate die package resonance. One approach is to use high quality, controlled-ESR (equivalent series resistance) capacitors on the package and the host circuit board to suppress the resonance. This solution is very costly. Another solution is adding an on-die dampening resistor in series to on-die decaps, which requires careful physical layout implementation. Often, designers also lower the impedance peak by reducing the package inductance and increasing the on-die decap capacitance, both of which have significant cost impact on product designs.

Figure 1:
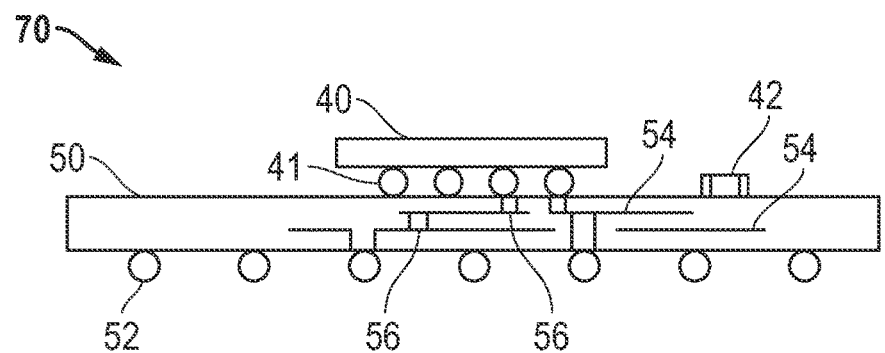
FIG. 1 illustrates in cross-section diagram form a packaged integrated circuit (IC) according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

In one form, a circuit is provided for reducing die package resonance of an IC die. The circuit includes an anti-resonance tuning circuit with a first branch including a first inductance coupled to one of an IC die positive power supply conductor and an IC die negative power supply conductor, and a second branch coupled directly to a selected one of a carrier substrate positive or negative conductive structures, the second branch comprising a second inductance inductively coupled to the first inductance.

In another form, an integrated circuit structure includes an IC die with positive and negative power supply conductors, a package, one or more decoupling capacitors, and an anti-resonance tuning circuit. The package includes a carrier substrate carrying the IC die, and positive and negative external power supply contacts connected to the IC die positive and negative power supply conductors through respective positive and negative conductive structures of the carrier substrate. The one or more decoupling capacitors are electrically connected between the positive and negative power supply conductors, and exhibit die package resonance. The anti-resonance tuning circuit including a first branch with a first inductance connected to one of the IC die positive or negative power supply conductors and a second branch connected to a selected one of the carrier substrate positive or negative conductive structures, the second branch including a second inductance inductively coupled to the first inductance.

In yet another form, a method of mitigating die package resonance in a packaged IC power distribution system comprises supplying power to digital circuitry on the packaged IC with positive and negative power supply conductors on the packaged IC supplied through positive and negative conductive structures in an IC package. The method further comprises operating the digital circuitry and mitigating power supply deviations to the digital circuitry with one or more decoupling capacitors. Current is inductively coupled through a circuit branch connected between at least one of the IC package positive or negative conductive structures and at least one of the IC positive or negative power supply conductors at a resonant frequency.

FIG. 1 shows a cross-sectional diagram of example prior art packaged IC 70 which may exhibit die package resonance. An IC die 40 is mounted on a carrier substrate 50 with solder bumps or balls 41 connecting to corresponding pads on carrier substrate 50, coupling IC die 40 to circuitry of carrier substrate 50. IC die 40 is connected to external circuitry through the package's external contacts 52, which may be ball grid array contacts or other suitable contacts such as pins. Carrier substrate 50 includes metal layers 54 in which circuitry including conductive traces or planes are formed, and includes metal traces and pads formed on the carrier substrate upper surface, which may carry components such as the depicted ceramic chip capacitor 42. Package vias 56 generally are connected between the carrier substrate 50 surface, metal layers 54, and external contacts 52. A PDN for IC die 40 includes not only circuitry within IC die 40, but power and ground conductors in metal layers 54 connected to IC die, and typically includes decaps mounted to carrier substrate 50 such as the depicted ceramic chip capacitor 42.

Figure 2:
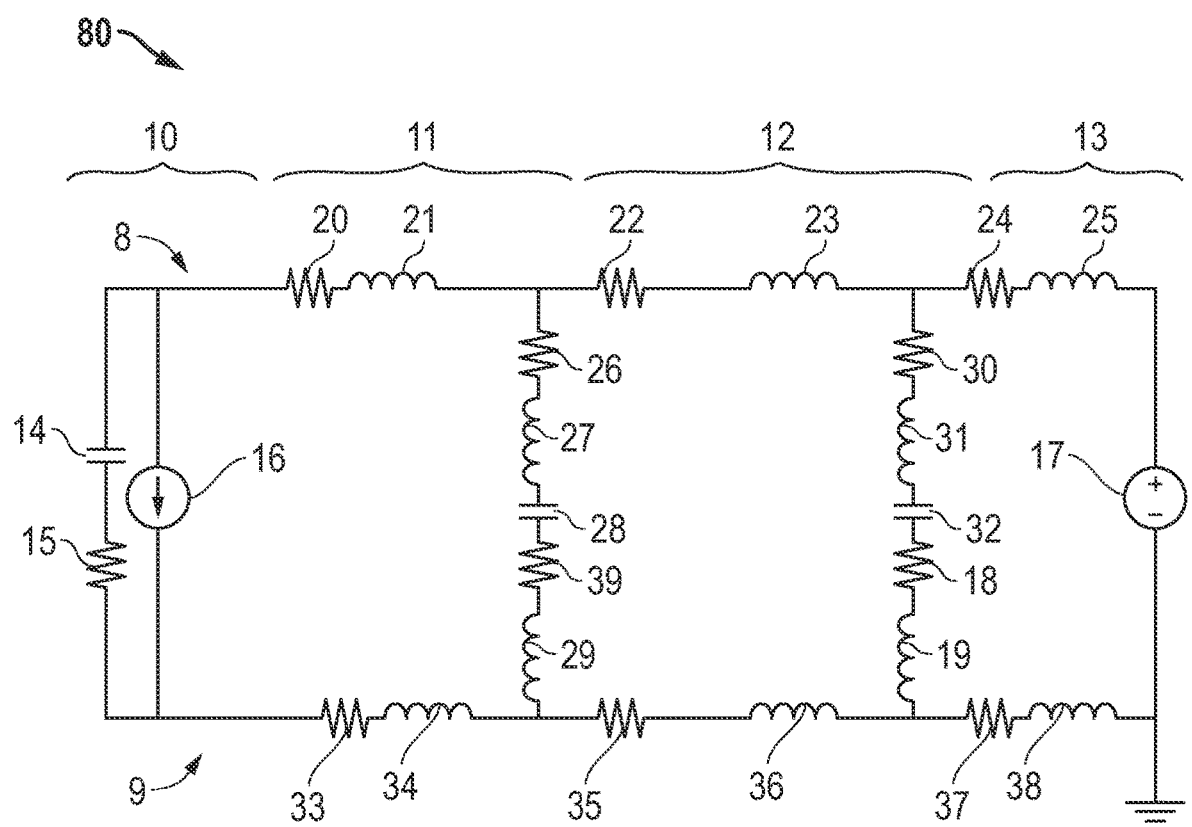
FIG. 2 illustrates in circuit diagram form an equivalent circuit of a power delivery network of a packaged IC mounted in a host system according to the prior art.

FIG. 2 shows an electrical equivalent circuit diagram for an example prior art PDN circuit model 80. The depicted PDN circuit model 80 is generally a model representing non-ideal conductors throughout the PDN, which each have an equivalent resistance and inductance. PDN circuit model 80 spans the IC die, the package, the host circuit board, and the power supply, with the positive supply conductors shown generally at 8, and the negative power supply conductors shown at 9. The bracket labelled 10 ("IC die 10") identifies the electrical equivalents for the portions of the PDN on the IC die. The bracket labelled 11 ("package circuitry 11") identifies the electrical equivalent circuitry for the package PDN conductors, and the bracket labelled 12 ("PCB circuitry 12") board identifies the electrical equivalents for a host printed circuit board PDN conductors. The bracket labelled 13 ("power supply 13") identifies the electrical equivalent circuitry for a host power supply.

Referring to IC die 10, the power load of circuitry on IC die 10 is represented with a variable current source 16 connected between positive power supply conductor 8 and negative power supply conductor 9. Capacitor 14 and resistor 15 represent the equivalent capacitance of IC die 10 and its ESR, and are connected in series between the power supply conductors 8 and 9. Package circuitry 11 includes positive and negative conductive structures in and on the carrier substrate which are connected to positive and negative power supply conductors 8 and 9, respectively. Positive conductive structures of package circuitry 11 are represented by resistor 20 and inductor 21, which represent the ESR and ESL of the various package traces, power planes, and pads that connect IC die 10 to the host system. Capacitor 28 ("package decaps 28") represents the sum of all the package decaps of the PDN. A series circuit connects package decaps 28 between the carrier substrate positive and negative conductive structures, and includes a resistor 26, representing the ESR of the package conductors connecting package decaps 28 between the positive and negative power supply conductors, an inductor 27, representing the ESL of package conductors on the positive side of package decaps 28, a resistor 39 representing the parasitic resistance of the package decaps 28, and an inductor 29 representing the parasitic inductance of package decaps 28. The total package inductance (represented by inductors 21 and 34), together with the package decaps 28 and the IC die 10 equivalent capacitance shown by capacitor 14, exhibit die package resonance causing a harmful impedance increase at a resonant frequency f generally given by Equation (1).

$$f = \frac{1}{2\pi\sqrt{LC}} \quad (1)$$

PCB circuitry 12 includes resistor 22 and inductor 23 representing the ESR and ESL of the positive power supply conductor of PCB circuitry 12, respectively. These conductors may include intermediate conductors such as sockets or multi-chip module contacts. Capacitor 32 represents the board-level decaps connected between the positive and negative power supply conductors of PCB circuitry 12. Resistance 18 and inductance 19 shown connected in series with capacitor 32 represent the capacitor's parasitic resistance and inductance. Resistance 30 and inductance 31 represent the parasitic resistance and parasitic of the conductors that connect capacitor 32 between the positive and negative power supply conductors of PCB circuitry 12. Referring to the power supply 13, a voltage supply 17 represents the power supply, with resistor 24 and inductor 25 representing the ESR and ESL of the conductors connecting the supply to the circuit board on the positive side. Power supply 13 may supply power for multiple packaged chips in the host system, for example memory IC's on a memory DIMM or high-bandwidth memory module, or it may supply power only to the IC die 10 or to a localized power domain within IC die 10.

Figure 3:
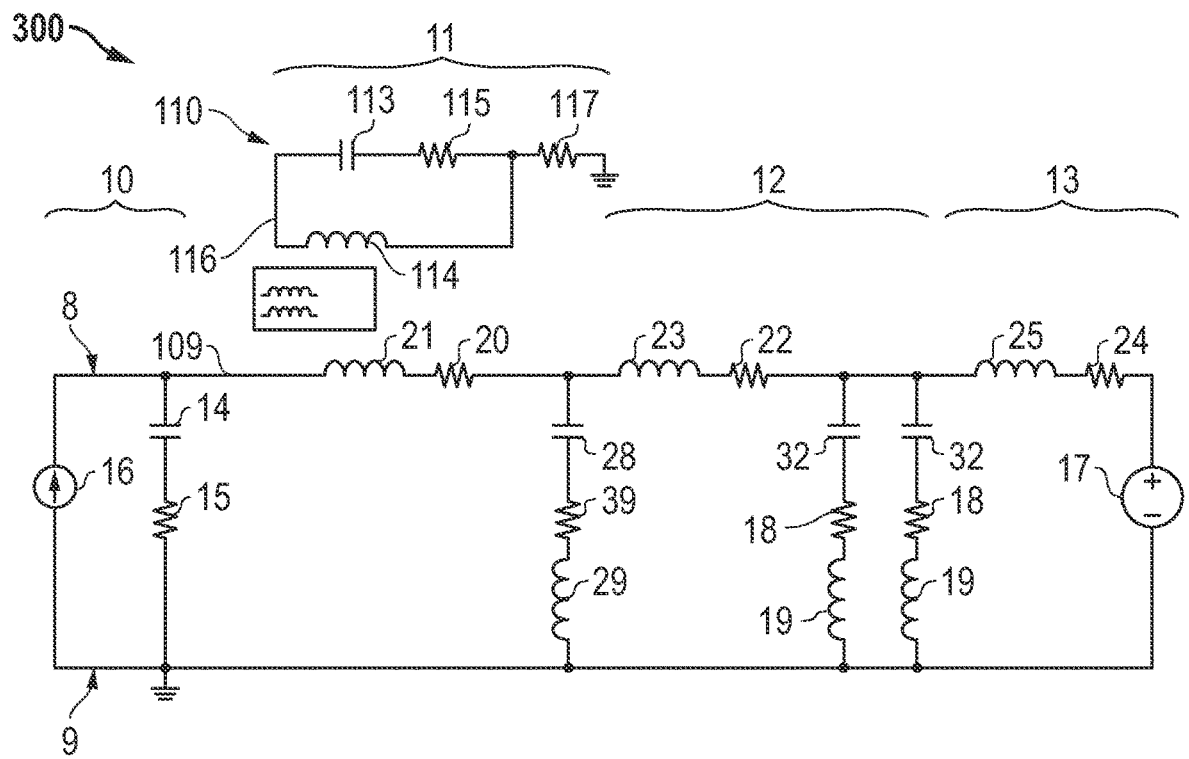
FIG. 3 illustrates in circuit diagram form a power delivery network for a packaged integrated circuit according to some embodiments.

FIG. 3 illustrates in circuit diagram form a power delivery network (PDN) 300 for a packaged IC according to some embodiments. The depicted circuit represents electrical equivalents of non-ideal physical components in PDN 300. The depicted PDN elements and their configuration follow the model developed with respect to FIG. 2, except for the addition of anti-resonance tuning circuit 110, and will not be described again in detail except where such detail is relevant.

Generally PDN 300 includes IC die 10, package circuitry 11, and PCB circuitry 12 supplied by power supply 13. The electrical equivalent circuit for IC die 10 is shown as a variable current source 16, the equivalent resistance of the IC die 10, represented by resistor 15, and the equivalent capacitance of the IC die 10, represented by capacitor 14. The equivalent values are typically provided for the entire IC, or for a relevant power domain within the IC. Either may be used. IC die 10 includes positive and negative power conductors 8 and 9, respectively, connected to package circuitry 11 through respective multiple conductive structures (such as, for example, package vias, bumps, traces, wire bonds, or solder pads). The positive conductive structures have an ESL represented by inductor 21, and an ESR represented by resistor 20. The negative conductive structures also have similar ESR and ESL not shown in order to simplify the drawing.

One or more decoupling capacitors, represented by package decaps 28, are connected between positive and negative power supply conductors of IC die 10. Such decoupling capacitors may include package level decap capacitors represented by capacitor 28, on-die capacitors (not separately shown) connected between the positive and negative power supply conductors, or both. While, in this version, package decaps 28 are located on the carrier substrate of package circuitry 11, in other embodiments, decaps may be provided on IC die 10. For embodiments in which an interposer is employed between IC die 10 and package circuitry 11, the interposer is also a suitable location for package decaps 28. As discussed with regard to FIG. 2, the decoupling capacitors and the ESLs of the package's multiple conductive structures together exhibit a die package resonance characteristic. This die package resonance characteristic has a resonant frequency at which the output impedance of the PDN 300 has a deleterious peak in value. The die package resonance characteristic may be measured in any suitable way allowing the measurement of package resonance, such as by measuring output impedance or output voltage ripple as it varies over frequency. A desired specification to reduce the die package resonance may also be measured and specified in a similar manner, such as, for example, a specified value of reducing output impedance, or a maximum specified voltage ripple such as a plus or minus 5% or 10% variation in the supply voltage on the IC die. In this embodiment, the die package resonance characteristic is measured through the output impedance of the PDN circuit over a desired frequency range including frequencies expected to be present during operation of IC die 10.

To mitigate such die package resonance, PDN 300 includes an anti-resonance tuning circuit 110 including a first branch 109 connected to positive power supply conductors 8, and a second branch 116 connected directly to a carrier substrate negative conductive structure. In some embodiments, first branch is connected to negative power supply conductors 9, and the second branch is connected to a carrier substrate positive conductive structure.

In this embodiment, first branch 109 is formed by a portion of positive power supply conductors 8, and includes a portion of the conductive structure thereof including an ESL expressing or forming inductance 21. Suitable structures for inductance 21 include conductive traces formed in metal layers of a carrier substrate (such as metal layers 54, FIG. 1), plated through-hole vias formed in a carrier substrate core, and discrete inductors mounted along the carrier substrate, for example.

Second branch 116 is an inductance-capacitance (LC) tank circuit including a second inductance 114, a tuning capacitor 113, a dampening resistance 115, and a resistor 117. Second inductance 114 is inductively coupled to first inductance 21 rather than being conductively connected to first branch 109, as indicated by the box between first inductance 21 and second inductance 114 showing inductive coupling. Tuning capacitor 113 and dampening resistance 113 are connected to second inductance 114 and have values sufficient to reduce the die package resonance characteristic below a desired threshold. While the LC tank circuit of second branch 116 has a variety of suitable configurations, in this embodiment tuning capacitor 113 has a first terminal connected to one terminal of inductance 114 and a second terminal connected to a first terminal of dampening resistance 115. Dampening resistance 115 has a second terminal connected to the second terminal of second inductance 114, and to a first terminal of resistor 117. The second terminal of resistor 117 is connected to ground, specifically the negative conductive structures of package circuitry 11.

First inductance 21 and second inductance 114 may be implemented with conductive traces in package circuitry 11 designed to have an ESL of the desired values, or may be constructed inductor components mounted along the carrier substrate or formed on the carrier substrate. Similarly to first inductance 21, suitable structures for second inductance 114 include conductive traces formed in metal layers of a carrier substrate, plated through-hole (PTH) vias formed in a carrier substrate core, and discrete inductors mounted along the carrier substrate, for example. The inductive coupling in this embodiment is accomplished by the two inductances 21 and 114 being located adjacent to and parallel to each other. Other suitable structures include any arrangement of inductive structures capable of transferring energy to the LC tank circuit from first branch 109 sufficient to achieve a specified damping effect. The coupling coefficient of the magnetic coupling between the inductors does not need to be high depending on the inductor values. For example, a coupling coefficient of under 0.5, such as 0.25, may be used in some embodiments.

Tuning capacitor 113 and dampening resistor 115 in this embodiment are implemented in package circuitry 11, but may be implemented on IC die 10. Resistor 117 is implemented in package circuitry 11, and has a low resistance value compared to that of dampening resistor 115, such as 100 ohms compared to 10 mega-ohms, and functions to help ensure the isolation of the LC tank circuit from the package circuits ground. Such improved isolation helps to ensure the depicted loop of second branch 115 including inductance 114, tuning capacitor 113, and dampening resistance 115 is properly terminated. Resistor 117 is not used in some embodiments.

Figure 5:
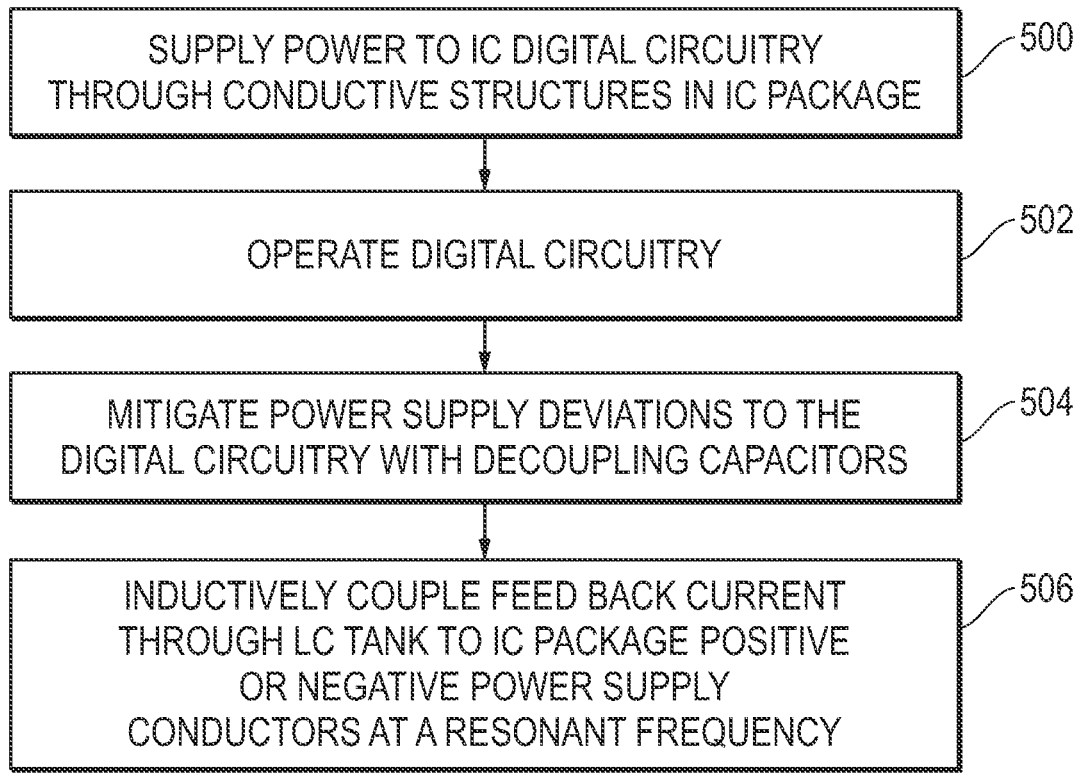
FIG. 5 illustrates a flow diagram of a process of mitigating die package resonance according to some embodiments.

In operation, anti-resonance tuning circuit 110 works to mitigate die-package resonance according to the process in the flow chart of FIG. 5. Referring to FIG. 5, while the process is shown in ordered blocks, generally the various electrical circuits function simultaneously as the IC operates, and the order shown in FIG. 5 is not intended to be limiting in any way. At block 500, IC die 10's digital circuitry is supplied with power through the various conductive structure of the package. At block 502, the IC die 10's digital circuitry operates, switching to perform digital logic functions in a manner that draws variable current from the PDN. Such current variations are often complex, including many different frequencies and spikes in current that tend to cause deviations the power supply voltage on IC die 10. At block 504, the PDN's decoupling capacitors, such as package decaps 28, help to mitigate such deviations by holding charge and supplying it upon heavy demand from the digital circuitry. However, as discussed above, the decoupling capacitors cause die package resonance at a resonant frequency, resulting in deleterious voltage variations on IC die 10's power supply.

At block 506, the process includes inductively coupling feedback current at a resonant frequency through a circuit branch of the anti-resonance tuning circuit, connected between at least one of the IC package positive or negative conductive structures and at least one of the IC positive or negative power supply conductors to mitigate the die package resonance. Block 506 may also include feeding back the current through a dampening resistor to help mitigate additional resonance in anti-resonance tuning circuit 110. Such feedback helps to prevent circulating currents that occur at the die package resonant frequency, which circulate through the package decaps 28 and the package ESL inductances represented by inductors 21.

The use of inductive coupling between first inductance 21 and second inductance 114 also provides advantages compared to directly connecting the LC tank circuit of second branch 116 into PDN 300. The coupling effect is stronger at the resonant frequency of the tank circuit, allowing the desired energy to be coupled out of PDN 300 more effectively. The depicted solution also makes a second use of existing conductive structures such as traces or PTH to couple away energy from die package resonance, reducing the complexity of the solution.

Referring again to the embodiment of FIG. 3, the various embodiments of anti-resonance tuning circuit 110 perform impedance adjustment by altering the output impedance of PDN 300 as measured at the IC die load represented by variable current source 16 (FIG. 3). The impedance adjustment is preferably achieved by the impedance function of anti-resonance tuning circuit 110, which has a zero centered at the frequency of the die package resonance, or approximately centered close enough to reduce the resonance peak by a desired amount to achieve a desired specification.

Impedance adjustment circuit 110 has the advantage of using much smaller capacitor values for tuning capacitor 113 than capacitors used in prior circuits that merely add decap capacitance. For example, the value of tuning capacitor 113 may be less than $1/10$ or $1/100$ of the value of package decaps 28. The smaller capacitor values not only saves cost and space, but eases the design process by allowing fewer decap capacitors to be used in many cases. Also, tuning capacitors 113 are not required to be controlled-ESR (equivalent series resistance) capacitors such as those often employed in known anti-resonance designs on a package or circuit board to suppress the resonance. Avoiding the use of controlled-ESR capacitors provides a cost savings. Multilayer ceramic capacitors (MLCCs) may be employed for tuning capacitors 113. Further, dampening resistance 115 may be provided by the ESR of one or more MLCCs at the resonant frequency. This option allows a desired value of dampening resistor 115 to be achieved with a selected combination of parallel or series MLCCs, with the parts selected from commonly available and low price parts. When a separate dampening resistor 115 is employed, it is allowed to be physically much smaller (and have a higher resistance value) than resistors used in solutions that place a dampening resistor in series with package decaps, which carry larger currents and require physically larger resistors for dampening. Dampening resistors 115 may also be implemented with on-die resistors, a more reliable process than accounting for ESRs in decap capacitors.

In embodiments for which tuning capacitors 113 are implemented in package circuitry 11, several options are available for constructing tuning capacitors 113. For example, some multi-chip module package circuitry designs use a high density cross-link (HDCL) die as an interposer in the package to provide high speed chip-to-chip interconnections. A conventional HDCL package includes a substrate portion and a high speed interconnect portion fabricated on the substrate portion. Tuning capacitors 113 may be implemented in metal layers of the high speed interconnect portion. Other package technologies employing organic interposers such as CoWoS®-R, L, and S (by TSMC) technologies are suitable technologies for implementing tuning capacitors 113, with the tuning capacitors formed on the interposer. Furthermore, other 2.5D integrated circuit packaging technology may be used, which combine multiple integrated circuit dies in a single package without stacking them into a three-dimensional integrated circuit with through-silicon vias. Tuning capacitors 113 can be formed in interposer metal layers of 2.5D packages, or may be mounted to such interposers.

Figure 4:
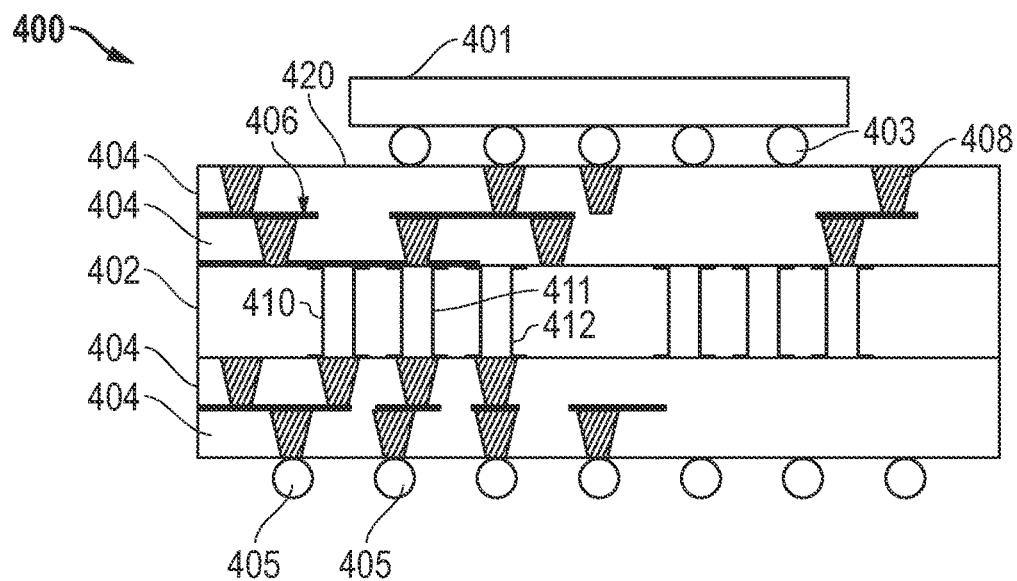
FIG. 4 illustrates in cross-section diagram form a packaged IC mounted onto a carrier substrate according to some embodiments.

FIG. 4 illustrates in cross-section diagram form a packaged IC 400 according to some embodiments. The drawing is not shown to scale. An IC die 401 is mounted to a carrier substrate 420 using solder bumps 403. Carrier substrate 420 in this embodiment is a laminated core based substrate including a rigid core 402 made of a glass and epoxy or other suitable material, and including built-up layers 404 constructed on both planar side of core 402 including patterned metalized layers often referred to as fanout layers or redistribution layers. Package vias 408 generally connect between the metal layers metalized layers and contacts formed to receive solder bumps 403 on the top side of carrier substrate 420, and the package external contacts, which in this embodiment are solder balls 405.

Rigid core 402 PTH vias 410, 411, and 412 which are holes through the core layer plated with conductive metal. In this embodiment, inductances 21 and 114 (FIG. 3) are formed by PTH vias 411 and 412. These two PTH vias are adjacent and parallel to each other and each exhibit an ESL expressing the value of a respective inductance 21 and 114. Because of this relative positioning, inductive coupling exists between PTH vias 411 and 412, which is employed to couple first branch 109 to second branch 116 (FIG. 3).

While in this embodiment PTH vias are used for inductances 21 and 114, other suitable structures are available as options. For example, in some embodiments using a coreless substrate, the inductive coupling is achieved by forming parallel traces in adjacent planar metalized layers of the carrier substrate. Constructing inductors in such a form is described, for example, in U.S. Pat. No. 10,355,661, issued Jul. 16, 2019 to the present inventor, which is hereby incorporated by reference.

Figure 6:
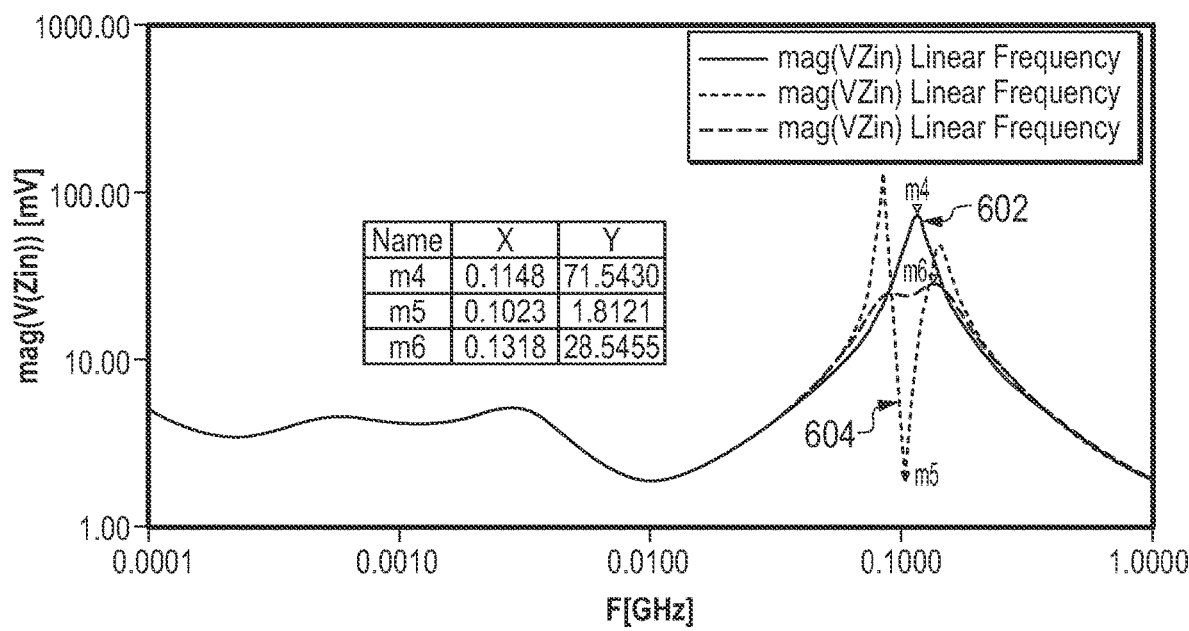
FIG. 6 illustrates in graph form a comparison of impedance performance of power delivery networks according to some embodiments.
Figure 7:
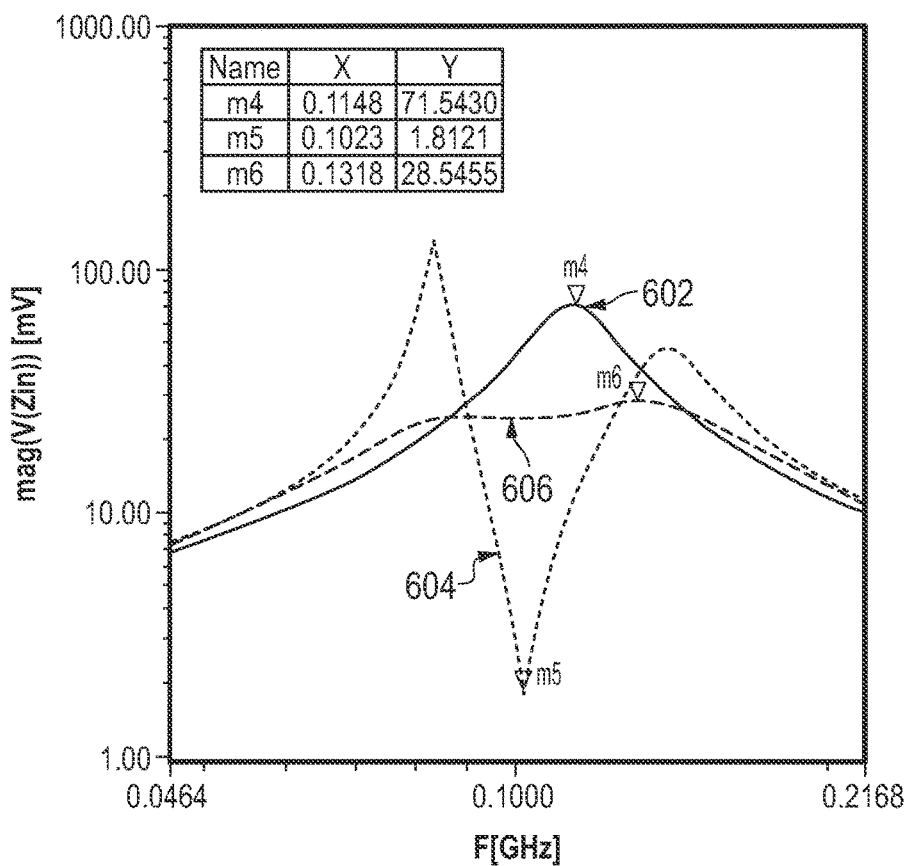
FIG. 7 illustrates in graph form an enlargement of a portion of the graph of FIG. 6.

FIG. 6 illustrates in graph form a comparison of impedance performance of power delivery networks according to some embodiments. FIG. 7 shows an enlarged portion of the same graph around the resonant frequency of the die package resonance. The graphs show the output impedance (the impedance magnitude) of the PDN measured by measuring voltage variation at the IC die 10 over a frequency range up to 270 MHz with a fixed load current, and are presented on a logarithmic scale. Peak values of the are presented in the table and labelled "m4", "m5", and "m6". Curve 602 shows the output impedance of a PDN with no anti-resonance tuning circuit, like that of FIG. 1. The die package resonance can be seen with a peak at slightly under 0.1 GHz. Curve 604 shows the output impedance of the PDN of FIG. 3, but without the dampening resistor 115 present in the anti-resonance tuning circuit. The effect of such an anti-resonance tuning circuit 110 can be seen to provide a zero or valley centered at the resonance frequency, while creating two smaller resonant peaks above and below the resonant frequency. In some applications, such a reduction of peak values may be sufficient to avoid the deleterious effect of the die package resonance without using a dampening resistor 115 and meet a designated specification for maximum PDN output impedance. Such a specification may also be provided as a maximum output voltage ripple, a maximum output voltage drop, or another suitable measurement that may be used to track the mitigation of die package resonance. A dampening resistor 115 is employed to provide further advantages and help meet a designated specification, as can be seen by curve 606, which shows the output impedance of the PDN of FIG. 3 including the dampening resistor 115. The effect of dampening resistor 115 is to dampen the additional peaks created by anti-resonance tuning circuit 110, and generally create a much lower peak impedance with a smoother variation over frequency. It is noted that the particular resonant frequency of die package resonance will vary across different ICs and applications, and the values of tuning capacitor 113, first inductor 21, second inductor 114, and dampening resistor 115 may be adjusted at the design phase to achieve the desired tuning of anti-resonance tuning circuit 110.

Design and construction of anti-resonance tuning circuit 110 for various embodiments herein may proceed according to an example process as follows. A PDN model circuit is produced reflecting equivalent values for the various parts the PDN, like that of FIG. 2. Care should be taken to include the equivalent parasitic inductance of the decoupling capacitors in the model (inductor 29 in FIG. 2). The resonance frequency of the PDN is estimated based on circuit analysis or simulation. From this, a tuning capacitance value may be selected for tuning capacitor 113, considering available package resources for implementing the first inductance 21 and second inductance 114. While many different capacitance values may achieve the desired resonance (when combined with a suitable inductor), typically a lower value is preferred to a higher value. The lower range of capacitance values is limited by the ESR of the particular capacitors employed, determined at the resonant frequency. Selection of the tuning capacitor 113 and second inductor 114 values may be iterative to achieve desired usage of package resources. The value of dampening resistor 115 may be determined by simulation, with the value adjusted so that it reduces the impedance peaks at and around the resonant frequency to a desired value. When MLCC capacitors are used, positioned on the carrier substrate, multiple MLCCs in parallel may be required to lower the total ESR so the design is feasible. (Similar considerations are taken into account for designs that employ on-die capacitors.) Once MLCC value(s) are selected, the ESR and ESL of conductive structures forming first inductance 21 and second inductance 114 are implemented to tune the circuit to lower the impedance peak, with the dimensions of conductive structure determined therefrom.

Any of the power delivery networks described above or any portions thereof such as anti-resonance tuning circuit 110 of FIG. 3 may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the techniques herein may be employed with PDNs on multi-chip modules and other package arrangements that do not simply include a single die on a package carrier. In a stacked memory module, for example, an anti-resonance tuning circuit on an upper stacked die may include a conductive structure passing through or passing by lower dies to a carrier substrate to achieve the conductive coupling of various embodiments herein. The description herein should be interpreted as supporting claims to the various described features in any functioning sub-combination. For example, an anti-resonance tuning circuit may include on-chip tuning capacitor may be combined in series with inductors and a resistor on a package carrier substrate. It should be noted that the series order of elements in anti-resonance tuning circuit 110 may be altered in any order without significantly effecting the operation, allowing any of the elements may be included on the IC die or on a carrier. Further, any of the elements of anti-resonance circuit 110 may be included in an alternate structure in a package or multi-chip module, such as, for example, a daughter carrier substrate, or a substrate vertically spanning multiple IC dies. Conductive structures of a mounting socket may also be included in the model without changing the overall techniques herein.

Accordingly, it is intended by the appended claims to cover all modifications of the disclosed embodiments that fall within the scope of the disclosed embodiments.

What is claimed is:

1. A circuit for reducing die package resonance of an integrated circuit (IC) die, the circuit comprising:
an anti-resonance tuning circuit comprising a first branch including a first inductance coupled to one of an IC die positive power supply conductor and an IC die negative power supply conductor, and a second branch coupled directly to a selected one of a carrier substrate positive or negative conductive structures, the second branch comprising a second inductance inductively coupled to the first inductance.

2. The circuit of claim 1, in which the first branch is conductively coupled to an IC die positive power supply conductor, and the second branch is connected to a selected substrate negative conductive structure.

3. The circuit of claim 1, in which the first inductance and the second inductance are constructed as plated through-hole conductors in the carrier substrate.

4. The circuit of claim 1, in which the first inductance and the second inductance are constructed with conductors in adjacent planar layers of the carrier substrate.

5. The circuit of claim 4, in which the carrier substrate is a coreless carrier substrate.

6. The circuit of claim 1, further comprising a tuning capacitor and a dampening resistance coupled to the second inductance, wherein the dampening resistance comprises an equivalent series resistance (ESR) of the tuning capacitor.

7. The circuit of claim 6, in which the tuning capacitor comprises a ceramic chip capacitor mounted on the carrier substrate.

8. The circuit of claim 6, further comprising one or more decoupling capacitors electrically connected between the IC die positive and negative power supply conductors, the one or more decoupling capacitors and equivalent series inductances (ESLs) of power conductors within a carrier substrate holding the IC die together exhibiting the die package resonance, wherein second branch has a resonant frequency matching that of the die package resonance, and the second inductance and dampening resistance are sized to reduce the die package resonance below a predetermined threshold.

9. An integrated circuit structure comprising:
an integrated circuit (IC) die including positive and negative power supply conductors;
a package including a carrier substrate carrying the IC die, and positive and negative external power supply contacts coupled to the IC die positive and negative power supply conductors through respective positive and negative conductive structures of the carrier substrate, one or more decoupling capacitors electrically connected between the positive and negative power supply conductors, the one or more decoupling capacitors exhibiting die package resonance; and
an anti-resonance tuning circuit comprising a first branch including a first inductance coupled to one of the IC die positive or negative power supply conductors and a second branch connected to a selected one of the carrier substrate positive or negative conductive structures, the second branch comprising a second inductance inductively coupled to the first inductance.

10. The integrated circuit structure of claim 9, in which the first branch is conductively coupled to the IC die positive power supply conductor and the second branch is connected to a selected substrate negative conductive structure.

11. The integrated circuit structure of claim 9, in which the first inductance and the second inductance are constructed as plated through-hole conductors in the carrier substrate.

12. The integrated circuit structure of claim 9, in which the first inductance and the second inductance are constructed with conductors in adjacent planar layers of the carrier substrate.

13. The integrated circuit structure of claim 12, in which the carrier substrate is a coreless carrier substrate.

14. The integrated circuit structure of claim 9, further comprising a tuning capacitor and a dampening resistance coupled to the second inductance, wherein the second inductance and dampening resistance are sized to reduce the die package resonance below a predetermined threshold.

15. The integrated circuit structure of claim 14, wherein the tuning capacitor and dampening resistance are connected in series across first and second terminals of the second inductance, and further comprising a second resistor connecting between the second terminal of the first inductance and the selected one of the carrier substrate positive or negative conductive structures.

16. The integrated circuit structure of claim 14, in which the tuning capacitor comprises a ceramic chip capacitor mounted on the carrier substrate.

17. The integrated circuit structure of claim 14, in which the dampening resistance consists essentially of an equivalent series resistance (ESR) of the tuning capacitor.

18. The integrated circuit structure of claim 9, in which the second branch has a resonant frequency matching that of the die package resonance.

19. A method of mitigating die package resonance in a packaged integrated circuit (IC) power distribution system, the method comprising:
  supplying power to digital circuitry on the packaged IC with positive and negative power supply conductors on the packaged IC supplied through positive and negative conductive structures in an IC package;
  operating the digital circuitry;
  mitigating power supply deviations to the digital circuitry with one or more decoupling capacitors; and
  inductively coupling feedback current through an inductance-capacitance (LC) tank circuit connected to at least one of the IC package positive or negative conductive structures, the LC tank circuit comprising a first branch including a first inductance coupled to at least one of the IC package positive or negative conductive structures, and a second branch coupled directly to a selected one of a carrier substrate positive or negative conductive structures, the second branch comprising a second inductance inductively coupled to the first inductance.

20. The method of claim 19, in which the LC tank circuit has an impedance function including a zero at a frequency of the die package resonance.

21. The method of claim 19, in which feeding back current further comprises feeding the current though a dampening resistor.

22. The method of claim 19, in which feeding back current further comprises feeding the current through a tuning capacitor in the IC package.

* * * * *